United States Patent
Aaltonen (10) Patent No.: US 12,044,697 B2
(45) Date of Patent: Jul. 23, 2024

(54) SAFETY MECHANISM FOR SENSORS

(71) Applicant: MURATA MANUFACTURING CO., LTD., Nagaokakyo (JP)

(72) Inventor: Lasse Aaltonen, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/691,311

(22) Filed: Mar. 10, 2022

(65) Prior Publication Data

US 2022/0373574 A1 Nov. 24, 2022

(30) Foreign Application Priority Data

May 19, 2021 (FI) .................................... 20215593

(51) Int. Cl.
G01P 21/00 (2006.01)
B81B 7/00 (2006.01)

(52) U.S. Cl.
CPC ............. *G01P 21/00* (2013.01); *B81B 7/008* (2013.01); *B81B 2201/0235* (2013.01); *B81B 2201/0242* (2013.01)

(58) Field of Classification Search
CPC ........................................................ G01P 21/00
See application file for complete search history.

(56) References Cited

U.S. PATENT DOCUMENTS

| | | | |
|---|---|---|---|
| 10,024,882 B2 | 7/2018 | Aaltonen et al. | |
| 2009/0241634 A1 | 10/2009 | Acar | |
| 2010/0145660 A1 | 6/2010 | Lang et al. | |
| 2012/0206134 A1 | 8/2012 | Fischer et al. | |
| 2014/0250971 A1 | 9/2014 | Fang et al. | |
| 2015/0377625 A1 | 12/2015 | Aaltonen | |
| 2016/0202286 A1 | 7/2016 | Aaltonen et al. | |
| 2017/0167876 A1 | 6/2017 | Coronato et al. | |
| 2017/0168087 A1 | 6/2017 | Gafforelli et al. | |
| 2017/0269121 A1 | 9/2017 | Weiland et al. | |
| 2020/0011702 A1 | 1/2020 | Clark | |
| 2020/0278205 A1 | 9/2020 | Kraver | |

FOREIGN PATENT DOCUMENTS

JP 2019-502910 A 1/2019

OTHER PUBLICATIONS

Japanese Notice of Reasons for Refusal, corresponding to JP Application No. 2022-039253, dated May 9, 2023.
European Search Report dated Jun. 23, 2022, corresponding to European Application No. 22154497.
Finnish Search Report dated Dec. 9, 2021 corresponding to Finnish Patent Application No. 20215593.
European Office Action issued in corresponding European Patent Application No. 22 154 497.6 on Feb. 28, 2024.

*Primary Examiner* — Walter L Lindsay, Jr.
*Assistant Examiner* — Andrew V Do
(74) *Attorney, Agent, or Firm* — SQUIRE PATTON BOGGS (US) LLP (57) ABSTRACT

The present invention relates to a method and an apparatus for detecting a failure of a sensor device during operation of the sensor device. A test signal is generated in a first frequency band that is above a signal frequency band of the sensor device and fed into a sensor element of the sensor device. A set of samples is obtained, and a magnitude value is derived from said at least two consecutive samples at the first frequency band. The magnitude value is compared to a magnitude threshold value that defines a minimum for the magnitude value and if the magnitude value is below the magnitude threshold value, it is determined that an error has occurred in the sensor device.

9 Claims, 8 Drawing Sheets

SAFETY MECHANISM FOR SENSORS

FIELD

The present invention relates to a method and an apparatus related to sensors. More particularly, the invention relates to a method, a system and a computer program related to a safety mechanism for microelectromechanical sensors.

BACKGROUND

Microelectromechanical systems (MEMS) constitute a technology of microscopic devices with both moving parts and electrical and/or electronic circuitry. A typical MEMS sensor device comprises a micromechanical sensor element that interacts with surroundings, and electronic circuitry for handling signals received from and fed towards the sensor element. Transducers provide required mechanical to electrical and electrical to mechanical signal conversions. An output transducer performs mechanical to electrical signal conversion and an input transducer perform an electrical to mechanical signal conversion.

Safety mechanisms are required in many modern safety critical applications of MEMS-based inertial sensors, such as acceleration sensors and gyroscopes. For example, a functional safety mechanism of electrical and/or electronic systems that are installed in serial production road vehicles is defined by Automotive Safety Integrity Level (ASIL) classification scheme in ISO26262 standard. When the product is designed for certain ASIL level, it must meet respective safety requirements.

A purpose of safety features is to report to a user when sensor data cannot be relied on. However, the added safety mechanisms should not affect performance of the sensor device and, preferably, costs added to the sensor device product by the safety features should be minimal. Typically, when MEMS sensor devices are used as inertial sensor devices, the safety features are preferably built on associated electronic circuitry, such as an ASIC, microcontroller, or an FPGA chip, of the sensor device. The electronic circuitry accesses raw data received from the mechanical sensor element via a transducer and analyzes it to determine, whether the sensor element operates as intended.

The electronics may comprise means for feeding a test signal towards the mechanical sensor element via an input transducer to enable continuous analysis of operation of the sensor based on the test signal traversing the sensor element. It is also important that the safety mechanisms do not react to any form of external excitation and do not produce so called false alarms based on the external excitation. Therefore, implementation of the self-test functionality may become complex.

DESCRIPTION OF THE RELATED ART

U.S. Ser. No. 10/024,882 B2 and U.S. Pat. No. 9,846,037 give examples on how self-test signals can be generated that can be used for continuous self-testing of microelectromechanical sensors without disturbing normal operation of the sensor.

U.S. Ser. No. 10/024,882 discloses continuous self-testing of a capacitive sensor, utilizing at least two self-test tones with distinctive fundamental frequencies.

U.S. Pat. No. 9,846,037 discloses continuous self-testing of a closed-loop vibratory gyroscope with test signals that are synchronized to the primary signal.

Patent application US2020/0011702 A1 discloses methods and systems for self-testing MEMS inertial sensors.

SUMMARY

An object is to provide a method and apparatus so as to solve the problem of providing a safety mechanism for a mechanical sensor. The objects of the present invention are achieved with a method according to claim 1 and an apparatus according to claim 10.

The preferred embodiments of the invention are disclosed in the dependent claims.

The present invention is based on the idea of detecting a deliberately increased noise level of the mechanical sensor device, or, in the simplest case, a peak-to-peak value. To implement an efficient noise-based safety mechanism, a noise-like test signal is fed towards the sensor element at a frequency range that is above the signal frequency band of interest for the sensor device and noise level at an output of the sensor element, for example at an output of the output transducer is detected. Alternatively, the output of the sensor element to be detected for safety mechanism may provide a pre-processed signal, wherein the pre-processing may comprise for example filtering and/or amplification of the output signal received from the output transducer.

According to a first aspect, a method for detecting a failure of a sensor device during operation of the sensor device is provided. The sensor element comprises a sensor element. The method comprises generating a test signal in a first frequency band that is above a signal frequency band of the sensor device. Magnitude of the test signal is at least 5 times, more preferably at least 10 times the magnitude of any intrinsic noise of the sensor element in the first frequency band. The method further comprises feeding the test signal into the sensor element, obtaining a set of samples comprising at least two consecutive samples of an output signal provided at an output of the sensor element during a sampling period and calculating a magnitude value from said set of samples, wherein the magnitude value is derived from said at least two consecutive samples at the first frequency band. The method also comprises comparing the magnitude value to a magnitude threshold value that defines a minimum for the magnitude value and if the magnitude value is below the magnitude threshold value, determining that an error has occurred in the sensor device.

According to a second aspect, The method further comprising continuously repeating said obtaining a set of samples, said calculating a magnitude value and said comparing the magnitude value for a plurality of sets of samples obtained during consecutive sampling periods to determine whether an error has occurred in the sensor device.

According to a third aspect, the method comprises determining a fail count threshold and initializing a fail counter, and, for each set of samples, repeating said obtaining a set of samples, said calculating a magnitude value and said comparing the magnitude value for a plurality of sets of samples obtained during consecutive sampling periods to determine whether an error has occurred in the sensor device. If occurrence of an error is determined, value of the fail counter is incremented. If no error is determined the fail counter is returned into its initial value. If current value of the fail counter equals with the error count threshold, it is determined that the sensor device fails.

According to a fourth aspect, the magnitude value is any one of a peak-to-peak value, a root-mean-square value and a standard deviation value.

According to a fifth aspect, the test signal comprises at least two discrete test tones, wherein each of the test tones reside within the first frequency band.

According to a sixth aspect, the test signal has a repeating envelope, and wherein length of the sampling period is equal or greater than the period of the envelope.

According to a seventh aspect, the test signal is a noise signal or a pseudorandom noise signal, and wherein the frequency band of the test signal is limited to the first frequency band.

According to an eighth aspect, the sensor device is a MEMS sensor device, and wherein the sensor element comprises one or more mechanical elements.

According to a ninth aspect, the sensor device is an inertial sensor device, such as an accelerometer or a gyroscope, or the sensor device is a pressure sensor, or the sensor device is a Hall effect sensor.

According to another aspect, an electronic circuitry comprising software, hardware, firmware or a combination thereof is provided, that that causes, when executed by the electronic circuitry to perform the method steps according to any one of the above aspects.

According to a first apparatus aspect, an apparatus for detecting a failure of a sensor device during operation of the sensor device is provided. The sensor device comprises a sensor element. The apparatus comprises test signal generating means configured to generate a test signal in a first frequency band that is above a signal frequency band of the sensor device, wherein magnitude of the test signal is at least 5 times, more preferably at least 10 times the magnitude of any intrinsic noise of the sensor element in the first frequency band. The apparatus comprises input transducer means configured to feed the test signal into the sensor element. The apparatus comprises sampling means configured to obtain, during a sampling period, a set of samples comprising at least two consecutive samples of an output signal provided at an output of the sensor element. The apparatus comprises calculating means configured to calculate a magnitude value from said set of samples, wherein the magnitude value is derived from said at least two consecutive samples at the first frequency band. The apparatus comprises comparing means configured to compare the magnitude value to a magnitude threshold value that defines a minimum for the magnitude value, and if the magnitude value is below the magnitude threshold value, determining that an error in the sensor device has occurred.

According to a second apparatus aspect, the apparatus is configured to continuously repeat said obtaining sets of samples during consecutive sampling periods, calculating the magnitude value and comparing the magnitude value to a magnitude threshold for the obtained of sets of samples.

According to a third apparatus aspect, the apparatus further comprise a fail counter and initialization means configured to initialize the fail counter. The sampling means, the calculating means and the comparing means are configured to process each set of samples, and, based on said processing if occurrence of an error is determined by the comparing means, to increment value of the fail counter, and if no error is determined by the comparing means, returning the fail counter into its initial value, and if current value of the fail counter equals with the error count threshold, to determine that the sensor device fails.

According to a fourth apparatus aspect, the magnitude value is any one of a peak-to-peak value, a root-mean-square value and a standard deviation value.

According to a fifth apparatus aspect, the test signal comprises at least two discrete test tones, wherein each of the test tones reside within the first frequency band.

According to a sixth apparatus aspect, the test signal has a repeating envelope, and wherein length of the sampling period is equal or greater than a period of the envelope.

According to a seventh apparatus aspect, the test signal is a noise signal or a pseudorandom noise signal, and wherein frequency band of the test signal is limited to the first frequency band.

According to an eighth apparatus aspect, the sensor device is a MEMS sensor device, and the sensor element comprises one or more mechanical elements.

According to a ninth apparatus aspect, the sensor device is an inertial sensor device, such as an accelerometer or a gyroscope, or the sensor device is a pressure sensor, or the sensor device is a Hall effect sensor. The present invention has the advantage that the invented safety mechanism is very simple to implement and requires minimal additional area and functionality to interface electronics, and/or an application specific integrated circuit (ASIC), a microcontroller, and/or an field programmable gate array (FPGA) chip used for processing data received form the sensor element. Interface electronics refer to electronic circuitry for converting a signal received from the mechanical sensor element into a signal format suitable for further signal processing, for example into a voltage or into a digital signal.

BRIEF DESCRIPTION OF THE DRAWINGS

In the following the invention will be described in greater detail, in connection with preferred embodiments, with reference to the attached drawings, in which.

DETAILED DESCRIPTION

The term "test signal" refers to a single signal with at least two distinctive test frequencies, also referred to as test tones, or to a plurality of signals each carrying at least one distinctive test frequency (test tone), or to a single signal carrying a band-limited noise signal or a band-limited pseudo-noise signal, or a combination thereof. The test signal is generated as an electrical signal and fed to the mechanical element via an input transducer that transforms the electrical test signal into a mechanical test signal.

The term "signal frequency band" refers to a frequency band on which the sensor element and the sensor device provides signals that represent values of the physical parameter sensed.

The term "output signal of the sensor element" refers to an output signal obtainable from the sensor element. The output signal of the sensor element can be obtained from an output transducer, in which case it typically represents a current, a capacitance or a resistance. Output signal of the sensor element may be a pre-processed signal. Pre-processing may comprise for example filtering and/or amplifying the signal received from the output transducer internally by the sensor device's interface circuitry. Frequency band of an output signal of the sensor element used for the invented safety mechanism may optionally be restricted so that it does not include information of the sensed parameter on the signal frequency band.

The term "output signal of the sensor device" may be a current or a voltage or a digital value, comprising information on a magnitude of a parameter sensed with the sensor device, for example acceleration, angular rate, pressure or magnetic field. Preferably, output signal of the sensor device excludes signals above the signal frequency band, such as the test signal.

External signals can easily increase sensor noise, but it is very unlikely that external excitation would cause external signals to cause sensor noise to appear lower than what it intrinsically is. When deliberately adding noise, or a test signal, to out-of-band frequency region, observation of a predefined minimum noise level can be made more reliable and faster. When the safety mechanism is built to detect a minimum noise level, it cannot observe faults that lead to increased noise or signal content. However, it may detect many fail cases that lead to decreased noise or signal content that would otherwise need custom safety features. Fails that decrease noise or signal content received from a MEMS sensor include, for example, failure in common mode (CM) control circuitry in a differential signal path that does not add differential signal, a mechanical issue where e.g. a particle prevents motion of an inertial mass, absence of detection voltage of the sensor element and/or a switch failure for example in capacitance-to-voltage converting transducer that would result in lower sensitivity that normal. Basically, any issues on the entire signal path that cause signal to be stuck at a value can thus be detected as a decrease in the deliberately added noise. A further security check can be performed by detecting intrinsic noise at the signal path, since many types of malfunction would also cause lack or significant reduction of intrinsic noise, too.

Figure 1:
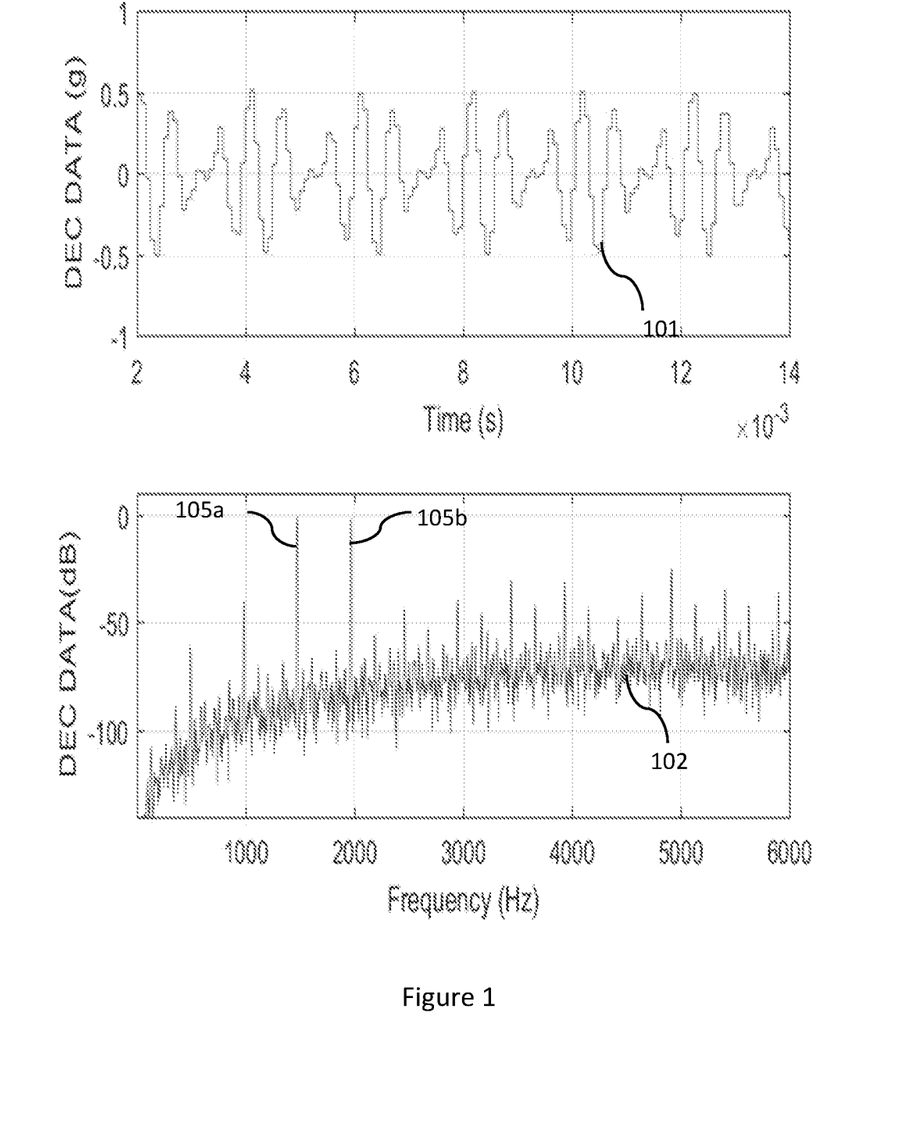
FIG. 1 illustrates the principle of using added noise as a safety measure.

The FIG. 1 illustrates, in simplified way, the principle of using deliberately added noise as a safety measure. In this example, a test signal comprising two test tones with known frequencies, representing the "noise", are electrostatically fed to a mechanical sensor element using an input transducer. In this example, both two test tones are set to have equal amplitudes. In the exemplary test bench, the sensor data is digitized in second order 1-bit Delta-Sigma Converter and a 3rd order cascaded integrator-comb (CIC) type decimation filter reduces analog-to-digital converter (ADC) bit rate by 64 to about 12 kHz. Upper graph illustrates digitized output signal (101) of the sensor element in time domain, and the lower graph shows the output signal (102) of the sensor element in frequency domain, with peaks (105a, 105b) indicating frequencies of the test tones. The mechanical sensor element may be for example an accelerometer or a gyroscope, but also mechanical sensor elements of other types of MEMS sensors such as a pressure sensor or a Hall effect sensor are applicable. Signal frequency band of the exemplary MEMS sensor device is up to 500 Hz and the test tones have frequencies 1.5 kHz and 2 kHz, which are clearly above the signal frequency band of the sensor device. This ensures that any effect of the test signal can be filtered out so that it does not have effect of the actual sensor readings. The respective envelope of these two test tones of the test signal has a period of 500 Hz. Consequently, obtaining data over a period of about 2 ms is enough for calculating a reliable peak-to-peak estimate of the output signal of the sensor element. An external signal, e.g. acceleration is highly unlikely to sum to one or both frequencies of the test tones so that the resulting peak-to-peak would be significantly lower than the average peak-to-peak result. The invention is not limited to the exemplary MEMS sensor device nor the specific signal frequency band or signal processing circuitry thereof, but the same principle is applicable generally to any sensor device implemented using MEMS technology and electrical signal processing capabilities into which it is possible to add or feed out-of-band noise signal that does not affect the operation of the sensor device in the signal frequency band. For example, signal frequency band of a MEMS pressure sensor may be only 10 Hz. In this case, two test tones comprised in the test signal could be at 30 Hz and 40 Hz.

An exemplary method for generating and feeding a test signal in a discrete time MEMS inertial sensor system is presented in U.S. Ser. No. 10/024,882. The inertial sensor has at least two inertial channels. One of the inertial channels can be biased with a test signal as needed, when (one of) the other inertial channel(s) is/are being detected to obtain sensor readings. Naturally, potential cross-coupling risk between channels need to be considered but this is quite straightforward. MEMS systems tend to have low-pass characteristics, which is which is due to typical mass-spring-damper system where moving mass, rotor, is reacting for example to external inertial force and causing the rotor to move with respect to the fixed inertial frame of reference of the sensor element where the mass-spring-damper system is anchored to. For example, accelerometer response is typically that of damped resonator, while rate-response of a gyroscope is that of low-pass filter, typically a peaking one. This means that when electrostatic pulses are fed at much higher rate that the bandwidth of the system, the pulse stream becomes filtered by the system itself and thus smoothened into a single input (test) frequency.

In the example shown in the FIG. 1, use of decimation filter data for 2 ms translates to reading of 24 consecutive samples and calculating the peak-to-peak (PP) value again when new set of 24 samples is available. Thus, the PP value calculation is updated about every 2 ms.

Figure 2:
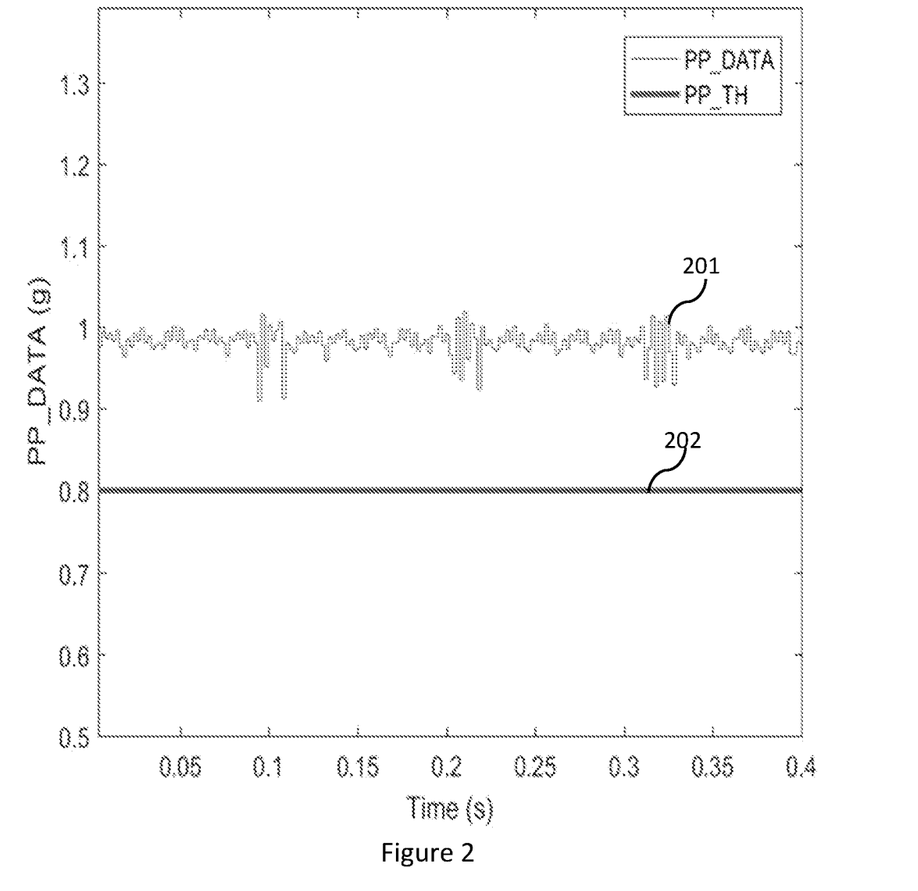
FIG. 2 illustrates exemplary magnitude of peak-to-peak values over time.

In the same exemplary system used for plotting data in the FIG. 1, the magnitude values, in this example peak-to-peak values (PP_DATA), appear over time as shown in the FIG. 2. Peak-to-peak value represents difference between the minimum and the maximum value in the samples of the output signal of the sensor element obtained during the sampling period. Dynamic range of the ADC is configured in the exemplary test bench to be more than +−100 g. Quantization noise causes some variation in the PP values (201), but it remains less than 10% from the average of all PP values. In this example, a minimum threshold (202) is defined for acceptable PP values (201); if the PP value would go below this minimum threshold (202), the sensor device does not function properly.

Although the example above has been given with a test signal with specific test tones, similar effect is caused by feeding band-limited noise or band-limited pseudo-noise in the sensor system. Like with specific test tones frequency band of any deliberately added noise should be significantly above the signal frequency band to avoid decreasing accuracy of the measurements by the added noise. The signal frequency band can also be referred to as the frequency band of interest. It is also important that the test signal, whether comprising band-limited noise, pseudo-noise signal and/or test tones, have significantly higher magnitude, for example at least 5×, preferably at least 10× higher magnitude, than remaining noise sources in the system in the frequency band of the test signal. Especially the peak-to-peak noise level with added signal should be higher than the intrinsic peak-to-peak noise level of the signal channel in the frequency band of the test signal. This way it can be seen reliably, in form of a lower than expected detected noise level, when sensor signal becomes blocked because of some mechanical or electrical failure. When band limited noise or pseudo-noise is used as test signal, characteristics of the noise or pseudo-noise shall also be considered when designing appropriate size for sampling windows. In case of using noise as test signal, the sampling window size, in other words length of the sampling period, and/or a fail counter can be selected so that false error detection threshold has a sigma probability that is preferably lower than 5-sigma or more preferably lower than 10-sigma. The same applies of course any type of combination of test tones used as the test signal.

Figure 3:
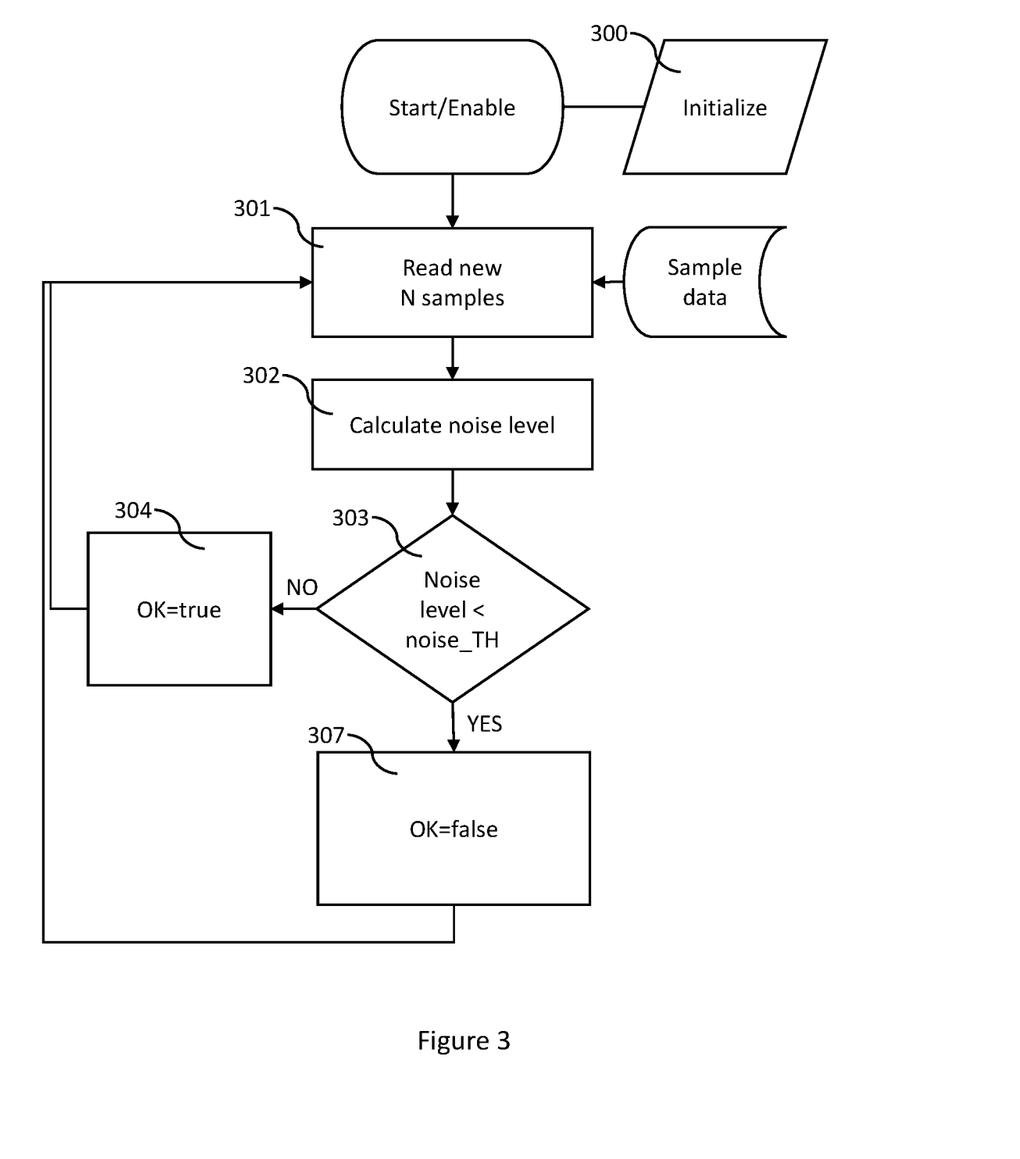
FIG. 3 shows a flow chart of a state machine according to an embodiment.

The FIG. 3 is a flow diagram of a first exemplary state machine for the error detecting safety mechanism according to an embodiment of the invention. In the following examples, term "noise level" is used to refer to a magnitude value. The state machine is initialized (300) by defining a noise level threshold value (noise_TH), which represents a magnitude threshold value. The noise level threshold value represents a minimum noise level. The noise level threshold value is defined for example for a peak-to-peak value, a RMS value or a standard deviation value. A plurality of samples of the output signal of the sensor element is read in the step 301. Obtained samples preferably carry all information content of the signal, i.e. there is no requirement to limit the samples to the test frequency band, and the samples may cover the wanted signal frequency band of the sensor but must cover the test frequency band. For enabling analysis of the signal content in the test frequency band, sampling of the output signal of the sensor element is preferably performed at a frequency that is high enough to enable later isolation of the test frequency band for implementing the safety mechanism. The same samples of the output signal of the sensor element can thus be used both for safety mechanism and for determining the sensed parameter simply by isolating the test frequency band and the signal frequency band of the sampled signal in subsequent signal processing correspondingly. Having just single sampling circuitry for multiple purposes enables simplifying circuitry of the sensor device.

In the phase 302, a noise level value is calculated based on the samples of the output signal of the sensor element. Noise level value is a magnitude value. In the phase 303 the calculated noise level value is compared to the noise level threshold value, representing a magnitude threshold value. If the calculated noise level value is greater than the noise level threshold value, the sensor device is deemed to pass the safety test and an OK flag is set to "true" in the phase 304. If the calculated noise level value is less than the noise level threshold value, the sensor device is deemed to fail the safety test and the OK flag is set to "false" in the phase 307.

An alert may be provided when the OK flag is false. The test is repeated as long as the sensor device is operational, returning to phase 301 for obtaining another plurality of new samples. Determination "OK=false" in the phase 307 can be considered as rising an "error flag", or status OK=false can be used to trigger rising error flag. Rising of the error flag refers to a situation in which the self-test recognizes that the sensor device is not operating properly, which can be indicated by rising an "error flag", which may for example be simply a change in a binary value of a signal output from the electronic circuitry, but may be implemented using any applicable method.

Figure 4:
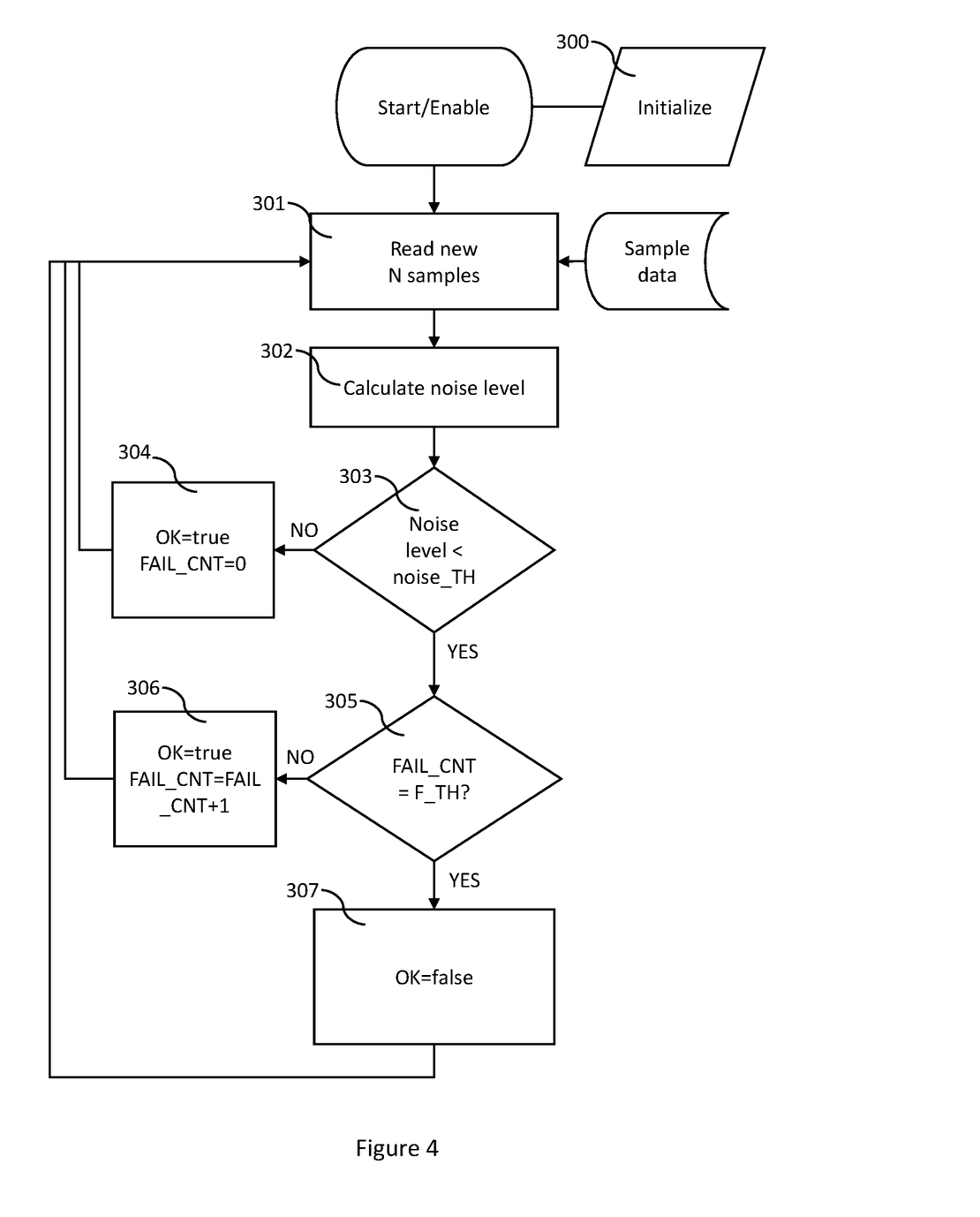
FIG. 4 shows a flow chart of a state machine according to another embodiment.

The FIG. 4 is a second exemplary state machine for the error detecting safety mechanism according to an embodiment of the invention. This exemplary state machine further improves error flag generation to be more robust towards external noise, such as mechanical noise, in comparison to the simpler noise level value calculation and comparison disclosed above.

During the initialization (300) a further parameter "fail count threshold" (F_TH) is defined, and a fail counter is zeroed. The fail counter is used to confirm that if more than one consecutive calculated noise level value fails to exceed the predefined noise level threshold value (noise_TH), then the checks fails, and an error flag is risen.

Steps 301 to 303 are similar to those disclosed in connection to the FIG. 3. Each calculated noise level value is compared to the predefined noise threshold value (noise_TH) in the step 303. Instead of directly rising the "error flag", i.e. setting OK status to "true" or "false" based on this comparison, comparison between the calculated noise level value and the noise level threshold is used for controlling the fail counter (FAIL_CNT). If the calculated noise level value is not below the noise level threshold in the step 303, OK is set to status "true" and the fail counter is set to zero. If the calculated noise level value does not exceed the noise level threshold in the step 303, it is checked in the step 305, whether the fail counter has achieved the fail count threshold (F_TH). If the fail counter equals the fail count threshold, OK-status is set to false and an error flag is risen. If the fail counter does not equal the fail count threshold, no error flag is risen. Instead, the Ok-status is kept as "true" and the fail counter is increased by one in the step 304. Thereafter, next N samples is analyzed in the phase 301.

Only after an integer number "F_TH", referred here as a fail count threshold, of consecutive comparisons in the step 303 between the calculated noise level values and the noise level threshold value fail, the OK is set to "false" in the step 307 and an error flag is thereby triggered. Consequently, comparing the fail counter to the fail count threshold (F_TH) allows trading between failure detection speed and robustness.

As understood by a skilled person, the state machine of FIG. 4 can be altered somewhat, while still achieving equivalent results. For example, the fail counter (FAIL_CNT) may be increased by one before it is compared to the fail count threshold in the step 305.

The test bench referred above was also used for testing various types of external noise. The sensor device tested comprised an ideal capacitive transducer, where input signals are directly modulating the plate capacitor gap. The motion magnitude of the sensor element was matched to g-sensitivity of rotor displacement in an accelerometer, which is initially detected as a change of capacitance. This capacitance is detected using a voltage bias, converted into a digital signal using a 1-bit sigma-delta analog-to-digital converter (ADC), and filtered and decimated down to sample rate of 12 kHz, which forms the output signal of the sensor element. The output signal of the sensor element shown in the following plots represents an acceleration value in comparison to normal acceleration g. Selecting acceleration as the reference value for magnitude of the signal is optional. Measured magnitude and the respective threshold can be any measurable parameter that can be obtained from an output of the sensor element or sensor device, such as acceleration, angular rate, capacitance, voltage or current.

Figure 5:
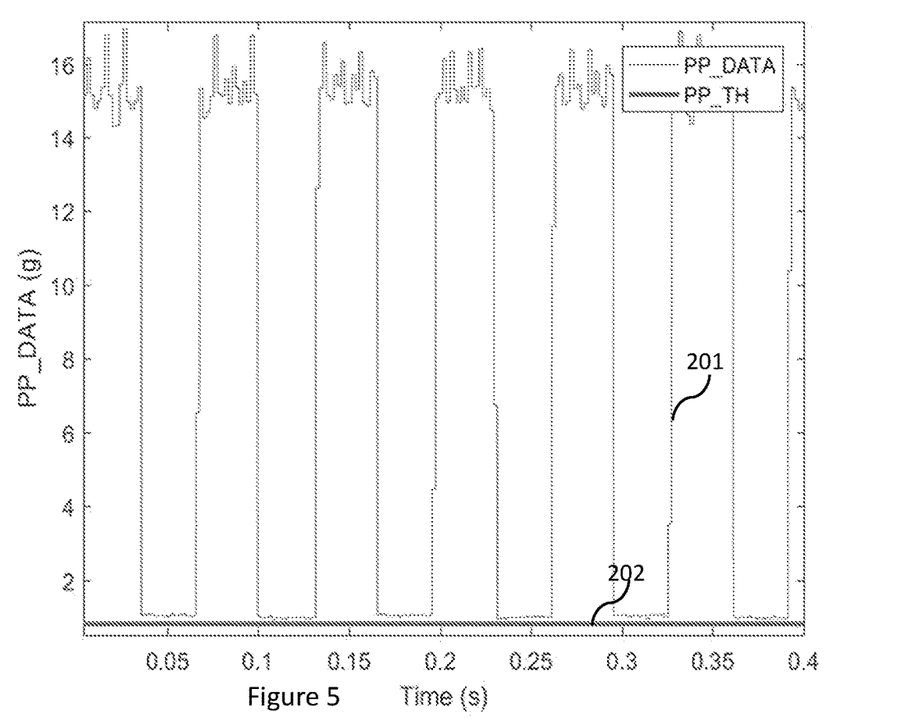
FIG. 5 illustrates magnitude values over time in presence of periodically enabled external sine.

FIG. 5 illustrates effect of a periodically switched external 100 Hz sine signal on the sensor device with 20 g magnitude. The external signal was switched periodically on an off for 30 ms at the time. In this example, the noise level signal detected was the peak-to-peak magnitude value (PP_DATA, 201), in other words magnitude difference between the highest and lowest output sample value, calculated from the plurality of consecutive samples of the output signal of the sensor element obtained during a sampling period, and noise level threshold was correspondingly defined as a peak-to-peak threshold (PP_TH, 202). In this example, a set of 24 consecutive samples were obtained during a sampling period and analyzed, but as explained above, the sampling period is a design parameter that depends, for example, on type of the used test signal and relationship between the frequency band of the test signal and the signal frequency band of the sensor device. The noise level threshold can be for example 0.8 g. It can be clearly seen from the output signal of the sensor element, that noise increases periodically due to presence of the external signal, but it does not decrease and thus the safety mechanism indicates that the sensor device operates correctly.

Figure 6:
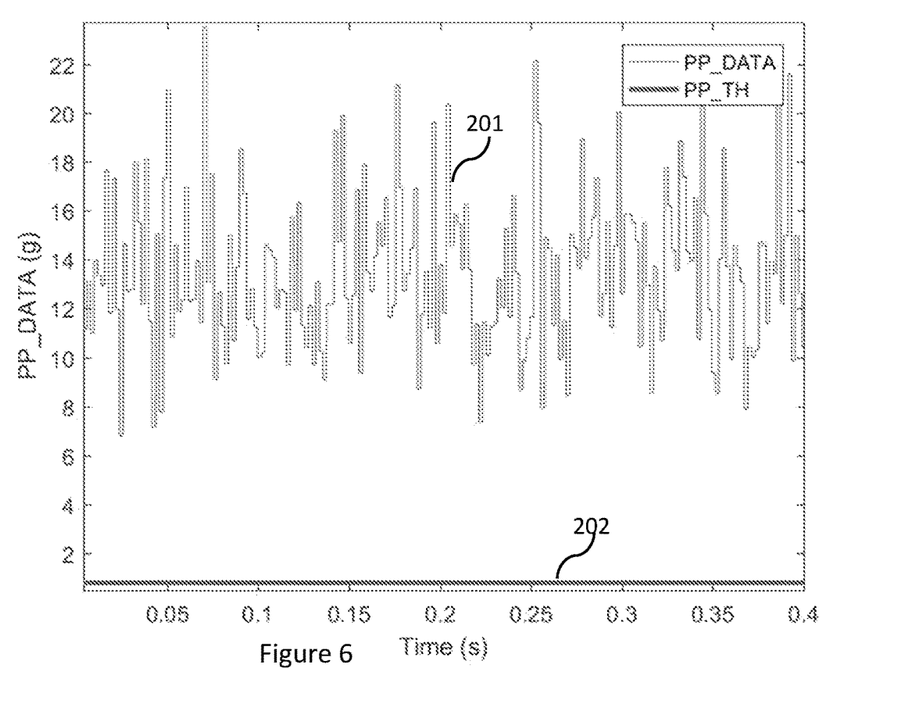
FIG. 6 illustrates magnitude values over time in presence of external random noise signal.

FIG. 6 illustrates noise levels obtained in another test case, in which random noise, corresponding to random external mechanical vibration affecting an accelerometer, was added around the frequency region in which the two test tones are. Again, the output signal's magnitude values, here represented by peak-to-peak values (PP_DATA, 201), increase rather than decrease due to the added noise. All magnitude values are clearly above the noise level threshold value (PP_TH, 202), which is the magnitude threshold value in these examples. Thus, it can be seen that externally added random noise does not cause failing of the safety mechanism either.

Figure 7:
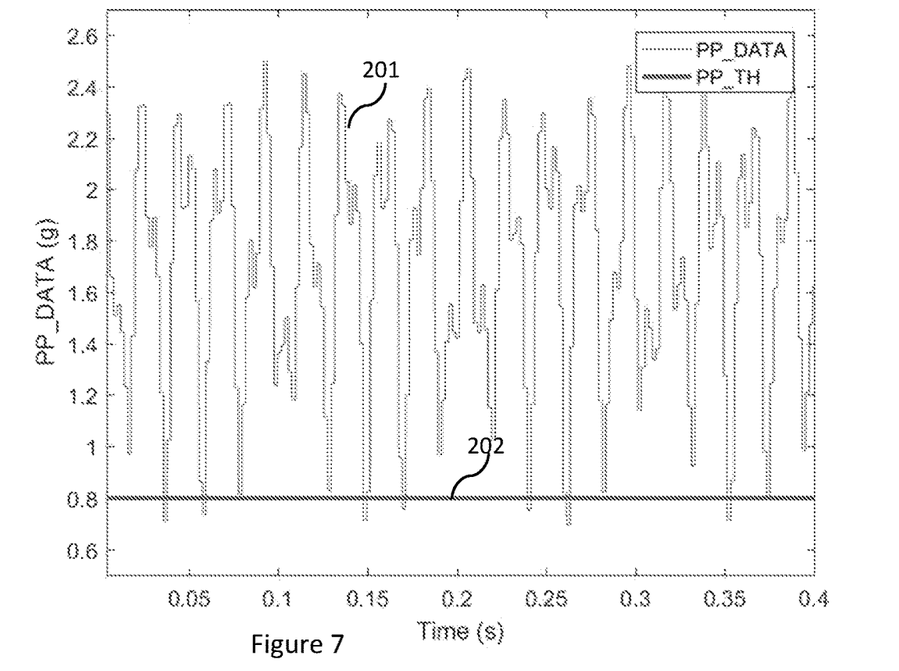
FIG. 7 illustrates magnitude values over time in presence of an external dual tone signal.

FIG. 7 illustrates detected noise levels obtained in a third test case, in which a safety mechanism using the two-tone test signal was subjected to external noise sources that have the same amplitude as the internal test signal and a frequency error of 5% and 3% for each test tone. Single noise level data points indicate error, caused by the calculated noise level value (PP_DATA, peak-to-peak noise level, 201). It is very unlikely that in real life a disturbance would occur that matches both test tones this accurately in both frequency and magnitude. Even in such unlikely case that it would occur, using the fail counter in the state machine with a fail counter threshold that is at least two, the safety mechanism would still determine that the sensor device is operating properly and no error flag is triggered, since no two consecutive samples were detected that would have a noise level value (PP_DATA, 201) that is below the noise level threshold value (PP_TH, 202).

Figure 8:
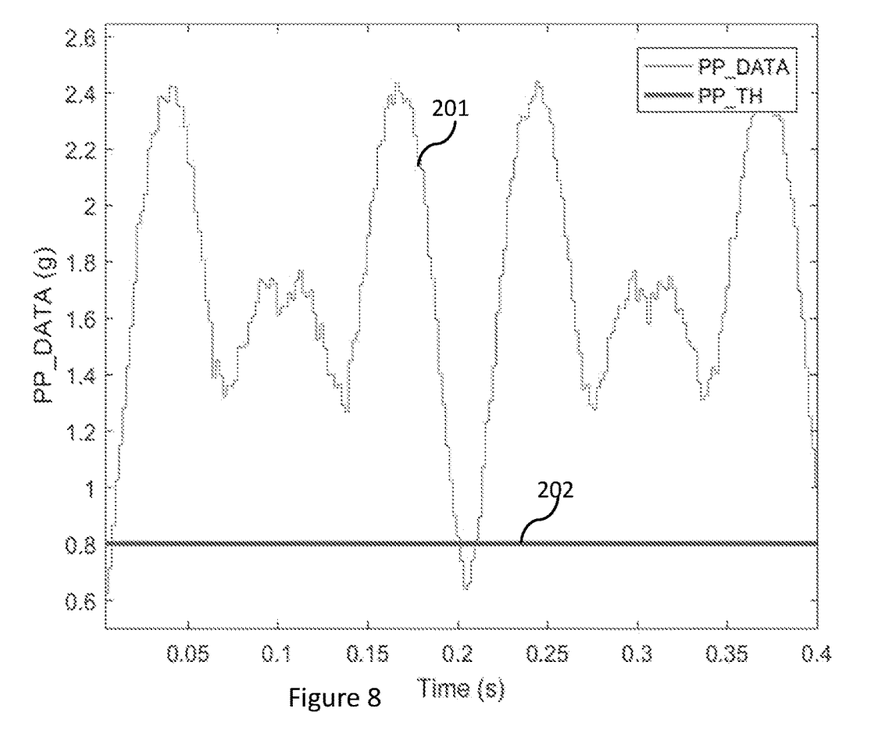
FIG. 8 illustrates magnitude values over time in presence of an external dual tone signal.

FIG. 8 illustrates detected noise levels (201) of another robustness test, in which the test was set deliberately to fail. This was achieved in the two test-tone test signal by providing an external noise comprised two noise components having magnitude equal to the two test tones of the test signal and frequencies matching with just 0.5% and 1% deviation from the test tones. Such close match of external noise source(s) to the test tones would be extremely rare. In this case, rising a false error flag can be prevented if the error count threshold is set for example to 10, or the noise threshold value, represented here by the peak-to-peak threshold value (PP_TH, 202) was set to a slightly lower value, for instance 0.7 g.

Figure 9:
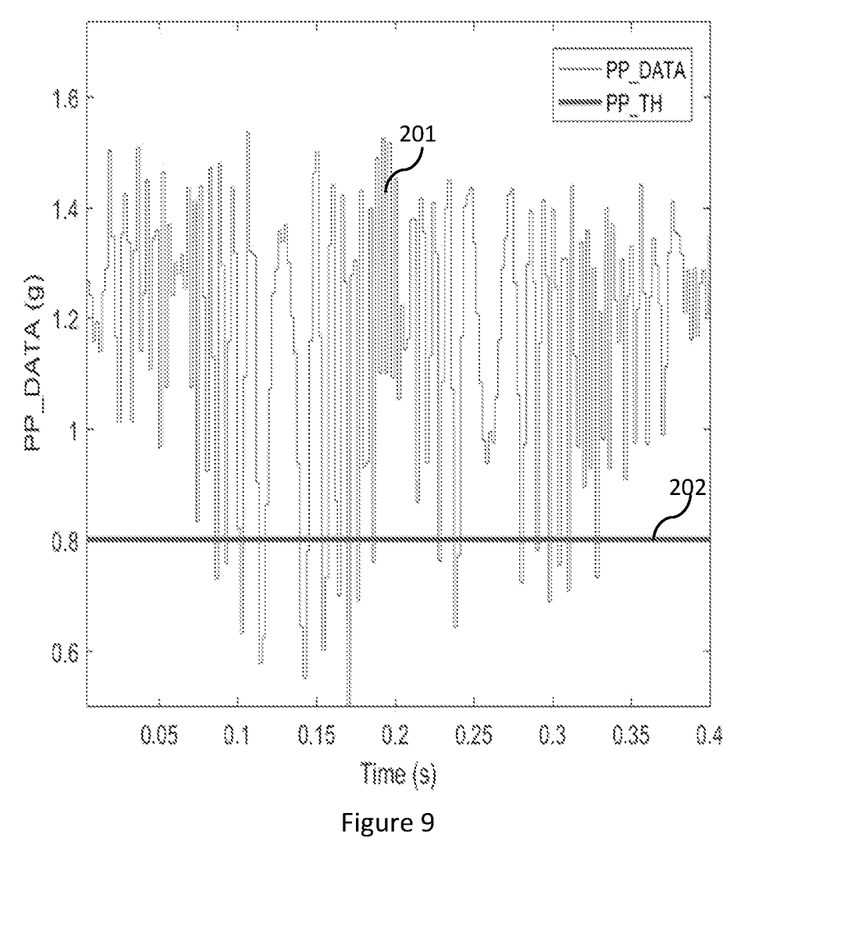
FIG. 9 illustrates magnitude values over time in presence of a continuously swept external sine that has same magnitude as a single test tone.

FIG. 9 illustrates results of yet another robustness test, in which a single test tone safety mechanism was tested using a sine sweep. Amplitude of the external sine noise signal had amplitude that matched one of the test frequencies and the frequency was swept from 1 kHz to 2.5 kHz in 0.4 s. Some noise magnitude threshold value (PP_TH, 202) crossings were detected by the magnitude value (PP_DATA, 201), but an error count threshold value of 5, suppressing rising an error flag if less than 5 consecutive samples would remain below the magnitude threshold value (202), would be sufficient to prevent any error flags.

Increased robustness of the safety mechanism can also be achieved by creating a more complex test signal, i.e. more test tones or more noise alike test excitation and using longer period of data for noise level calculation, but this easily leads to more complex and less tunable implementation. It is very important that the added "noise" is not visible in the signal frequency band of interest.

Figure 10:
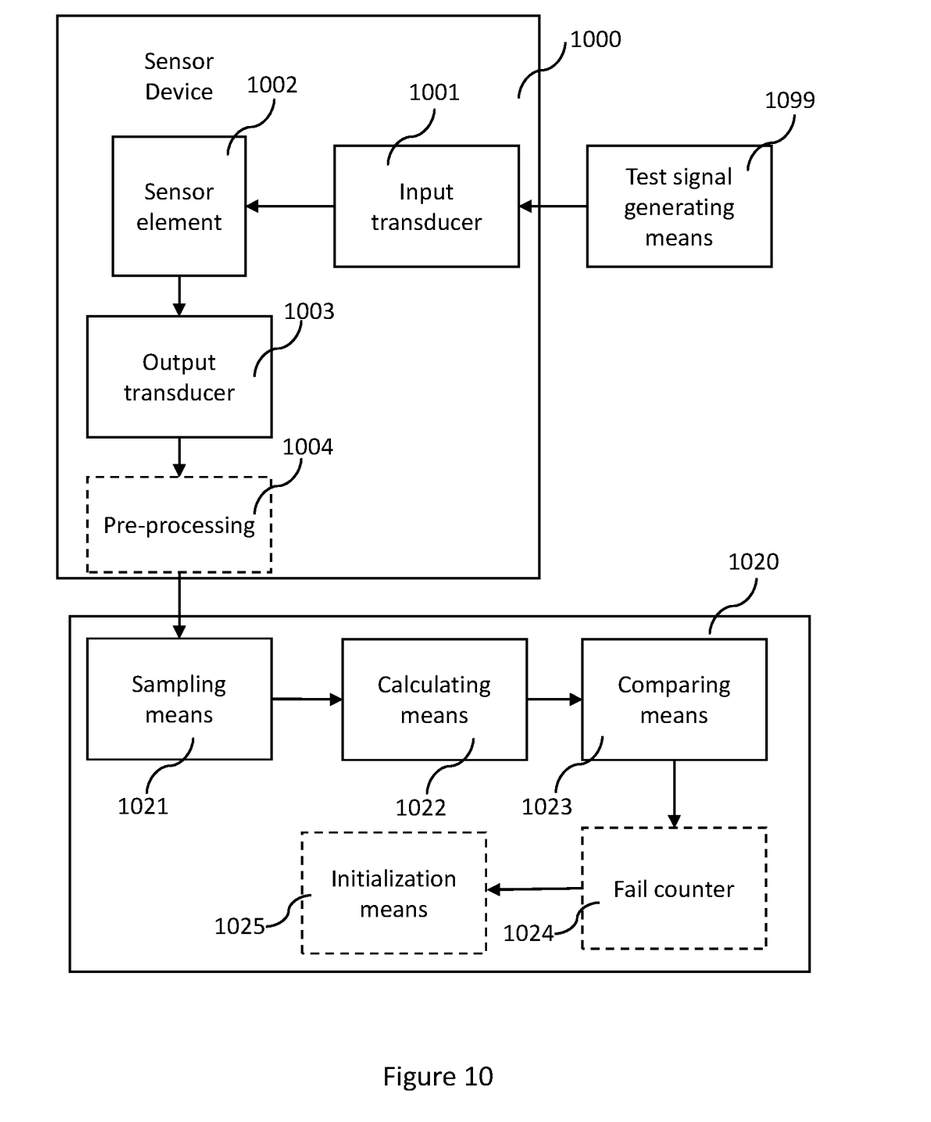
FIG. 10 illustrates an example apparatus according to some embodiments.

FIG. 10 illustrates an example apparatus according to some embodiments. The apparatus comprises a sensor device 1000, such as a MEMS sensor device, e.g., an inertial sensor device, a pressure sensor or a Hall effect sensor and electronic circuitry 1020, such as an ASIC, microcontroller, or an FPGA chip. A test signal generating means 1099 (e.g., test signal generating circuitry such as an ASIC, microcontroller, or an FPGA chip) feeds the test signal into the sensor element of the sensor device 1000 via an input transducer 1001. The input transducer 1001 transforms an electrical test signal into a mechanical test signal for feeding the test signal to the sensor element 1002. An output transducer 1003 converts a mechanical signal given by the sensor element into an electrical output signal which may be pre-processed by pre-processing means 1004, which may comprise, for example, amplifiers and/or filters, and in some embodiments, an analog-to-digital converter (ADC), to generate a digital signal. The electrical output signal from the sensor device 1000 is processed by the electronic circuitry 1020, such as an ASIC, microcontroller, or an FPGA chip, comprising sampling means 1021, calculating means 1022 configured to calculate a magnitude value from said samples, and comparing means 1023 configured to compare the magnitude value to a magnitude threshold value. The electronic circuitry 1020 further optionally comprises a fail counter 1024, wherein value of the fail counter is configured to be increased upon determining occurrence of an failure (e.g., error) determined by the comparing means 1023. The electronic circuitry 1020 further optionally comprises an initialization means 1025 configured to initialize the fail counter 1024.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. An apparatus for detecting a failure of a sensor device comprising a sensor element during operation of the sensor device, the apparatus comprising:
test signal generating circuitry configured to generate an electrical test signal in a first frequency band;

an input transducer configured to transform the electrical test signal into a mechanical test signal and to feed the mechanical test signal into the sensor element; and an application specific integrated circuit (ASIC), a microcontroller, and/or a field programmable gate array (FPGA) chip comprising:

sampling means configured to obtain samples of an output signal provided at an output of the sensor element during a sampling period;

calculating means configured to calculate a magnitude value from said samples, wherein the magnitude value is any one of a peak-to-peak value, a root-mean-square value and a standard deviation value; and comparing means configured to compare the magnitude value to a magnitude threshold value that defines a minimum for the magnitude value, and if the magnitude value is below the magnitude threshold value, determining that an error in the sensor device has occurred;

wherein the application specific integrated circuit (ASIC), a microcontroller, and/or a field programmable gate array (FPGA) chip is configured to output an output signal indicating an error in the sensor device has occurred based on the determining that the error in the sensor device has occurred, the first frequency band is above a signal frequency band of the sensor device, wherein magnitude of the test signal is at least 5 times the magnitude of any intrinsic noise of the sensor element in the first frequency band, said samples comprise a set of samples comprising at least two consecutive samples of the output signal provided at the output of the sensor element during the sampling period, and the magnitude value is derived from said at least two consecutive samples at the first frequency band.

2. The apparatus according to claim 1, wherein the application specific integrated circuit (ASIC), the microcontroller, and/or the field programmable gate array (FPGA) chip further comprises:

a fail counter; and initialization means configured to initialize the fail counter, and wherein the sampling means, the calculating means and the comparing means are configured to process each set of samples, and, based on said processing:

if occurrence of an error is determined by the comparing means, to increment value of the fail counter; and if no error is determined by the comparing means, returning the fail counter into its initial value; and if current value of the fail counter equals with the error count threshold, to determine that the sensor device fails.

3. The apparatus according to claim 1, wherein the test signal comprises at least two discrete test tones, wherein each of the test tones reside within the first frequency band.

4. The apparatus according to claim 3, wherein the test signal has a repeating envelope, and wherein length of the sampling period is equal or greater than a period of the envelope.

5. The apparatus according to claim 1, wherein the test signal is a noise signal or a pseudorandom noise signal, and wherein frequency band of the test signal is limited to the first frequency band.

6. The apparatus according to claim 1, wherein the sensor device is a MEMS sensor device, and wherein the sensor element comprises one or more mechanical elements.

7. The apparatus according to claim 1, wherein the sensor device is an inertial sensor device, or the sensor device is a pressure sensor, or the sensor device is a Hall effect sensor.

8. The apparatus according to claim 7, wherein the inertial sensor device comprises one of an accelerometer and a gyroscope.

9. The apparatus according to claim 1, wherein the magnitude of the test signal is at least 10 times the magnitude of any intrinsic noise of the sensor element in the first frequency band.

\* \* \* \* \*